(12) United States Patent
Van Herpen et al.

(10) Patent No.: US 7,262,423 B2
(45) Date of Patent: Aug. 28, 2007

(54) RADIATION SYSTEM AND LITHOGRAPHIC APPARATUS

(75) Inventors: Maarten Marinus Johannes Wilhelmus Van Herpen, Heesch (NL); Johannes Hubertus Josephina Moors, Helmond (NL); Derk Jan Wilfred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/292,310

(22) Filed: Dec. 2, 2005

(65) Prior Publication Data

US 2007/0125963 A1   Jun. 7, 2007

(51) Int. Cl.
*G01B 9/02* (2006.01)
(52) U.S. Cl. .............................. 250/492.2; 250/504 R; 378/34
(58) Field of Classification Search ............. 250/492.2, 250/504 R; 378/34
See application file for complete search history.

(56) References Cited

U.S. PATENT DOCUMENTS 4,408,338 A   10/1983  Grobman ..................... 378/34

7,098,466 B2 *   8/2006  Chandhok et al. ......... 250/492.2
2002/0001363 A1   1/2002  Kondo
2006/0245044 A1 *  11/2006  Apetz et al. ................ 359/359

FOREIGN PATENT DOCUMENTS

| EP | 1 274 287 A1 | 1/2003 |
| EP | 1 349 010 A1 | 10/2003 |
| EP | 1 396 758 A2 | 3/2004 |
| WO | 2004027842 A1 | 4/2004 |

OTHER PUBLICATIONS

European Search Report issued in EP Application NO. 06 07 7059 dated May 3, 2007.

* cited by examiner

*Primary Examiner*—Kiet T. Nguyen
(74) *Attorney, Agent, or Firm*—Pillsbury Winthrop Shaw Pittman LLP (57) ABSTRACT

A radiation system for generating a beam of radiation is disclosed. The radiation system includes a pulsed EUV source for generating EUV radiation, and a spectral filter mounted in front of the EUV source for selectively passing a spectral range of a beam of EUV radiation from the EUV source. The spectral filter is mounted on a movable mount configured to be moved in synchronicity with the pulsed EUV source to prevent debris traveling from the EUV source from impacting the spectral filter. Accordingly, the spectral filter is kept substantially free from contamination by the debris.

20 Claims, 5 Drawing Sheets

RADIATION SYSTEM AND LITHOGRAPHIC APPARATUS

FIELD

The present invention relates to a radiation system and a lithographic apparatus that includes a radiation system. Specifically, the invention relates to a radiation system for generating a beam of radiation that includes a pulsed EUV source for generating EUV radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In addition to EUV radiation, radiation sources used in EUV lithography generate contaminant material that is harmful for the optics and the working environment wherein the lithographic process is carried out. Such is especially the case for EUV sources operating via a laser induced plasma. Hence, in EUV lithography, a desire exists to limit the contamination of the optical system that is arranged to condition the beams of radiation coming from an EUV source. Furthermore, it can be desirable to provide spectral filtering to the radiation coming from the EUV source since in addition radiation may be produced which is preferably kept out of the optical path downstream of the radiation source, especially the illumination system and projection system which are used for conditioning an EUV radiation beam and projecting said beam onto a substrate, respectively. To spectrally filter an EUV radiation beam a variety of materials are known which can provide such filter function, however, due to the debris traveling from the EUV source, the positioning of such materials in the optical path can be problematic.

SUMMARY

It is desirable to provide a spectral filter for a generated EUV beam while keeping the filter clear from debris. It is further desirable to provide a method of spectrally filtering a beam of radiation for a pulsed EUV source.

According to an aspect of the invention, a radiation system for generating a beam of radiation is provided. The radiation system includes a pulsed EUV source for generating EUV radiation, and a spectral filter mounted in front of the EUV source for selectively passing a spectral range of a beam of EUV radiation from the EUV source. The spectral filter is mounted on a movable mount configured to be moved in synchronicity with the pulsed EUV source.

According to another aspect of the invention, a method of spectrally filtering a beam of radiation is provided. The method includes generating EUV radiation with a pulsed EUV source, selectively passing a spectral range of a beam of EUV radiation from said EUV source through a spectral filter mounted in front of the EUV source, and moving the spectral filter in synchronicity with the pulsed EUV source to prevent debris traveling from the EUV source from impacting the spectral filter.

According to a further aspect of the invention, a lithographic apparatus is provided. The apparatus includes a radiation system for generating a beam of radiation. The radiation system includes a pulsed EUV source for generating EUV radiation, and a spectral filter mounted in front of the EUV source for selectively passing a spectral range of a beam of EUV radiation from the EUV source. The apparatus also includes a patterning device for patterning the beam of radiation, and a projection system for projecting the patterning beam of radiation onto a substrate. The spectral filter is mounted on a movable mount configured to be moved in synchronicity with the pulsed EUV source.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
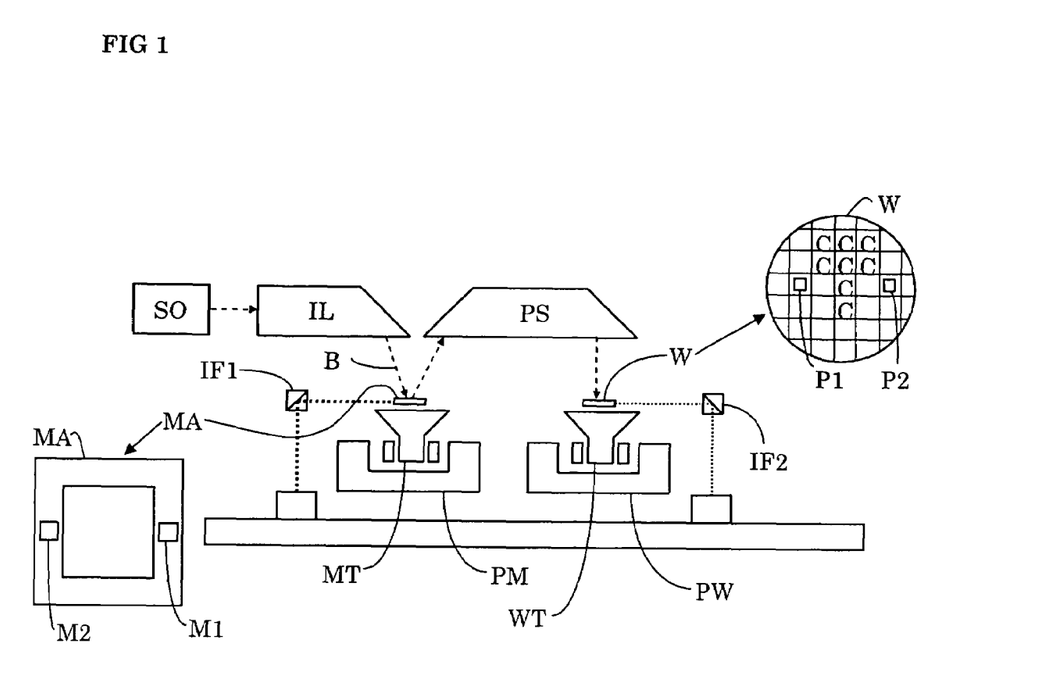
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
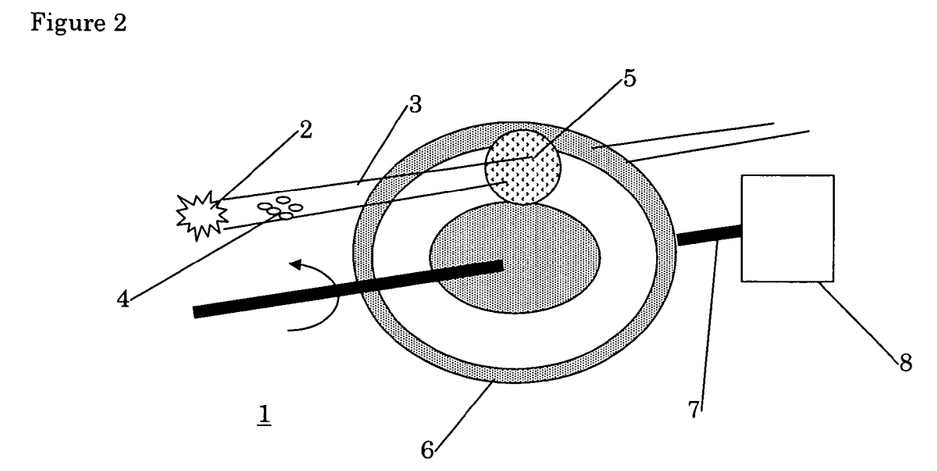
FIG. 2 depicts a first embodiment of the invention.

A first embodiment of a radiation system 1 according to the invention is depicted in FIG. 2. Typically, the radiation system 1 comprises a laser induced plasma source 2 such as a tin or Xe source, however, other sources are possible. The source 2 depicted in FIG. 2 is typically operated in a pulsed way so that periodically EUV radiation 3 is generated in conjunction with debris 4 traveling from the source 2. Typical operating frequencies are in the range of several (tens of) kHz. For filtering purposes of the source 2, for instance, for selectively passing EUV radiation 3 in a wavelength range of 10–20 nm a spectral filter 5 is mounted in front of the EUV source 2.

Typical materials for providing such a spectral filter may comprise a Zr/Si multilayer filter or a Zr/Nb multilayer filter.

The spectral filter 5 is mounted on rotating disc 6 that is distanced from the source 2. The disc is rotated about an axis 7 by appropriate drive means, in particular, a motor 8.

By choosing an appropriate distance based on a mean velocity of debris and the speed of light, debris 4 traveling from the source 2 can be separated from EUV radiation 3 generated from the source 2. The rotating disc 6 is moved in synchronicity with the pulsed EUV source 2 to prevent traveling debris 4 from impacting the spectral filter 5. Here, the term "in synchronicity" indicates that the disc has an identical operating frequency as the pulsed EUV source 2 has, or, alternatively, that the disc has an operating frequency which is matched to the pulsed laser source frequency as a higher order frequency. In this way, the spectral purity filter 5 can be kept free from debris 4 at all times. In the embodiment of FIG. 2 the disc 6 has an open structure.

Figure 3:
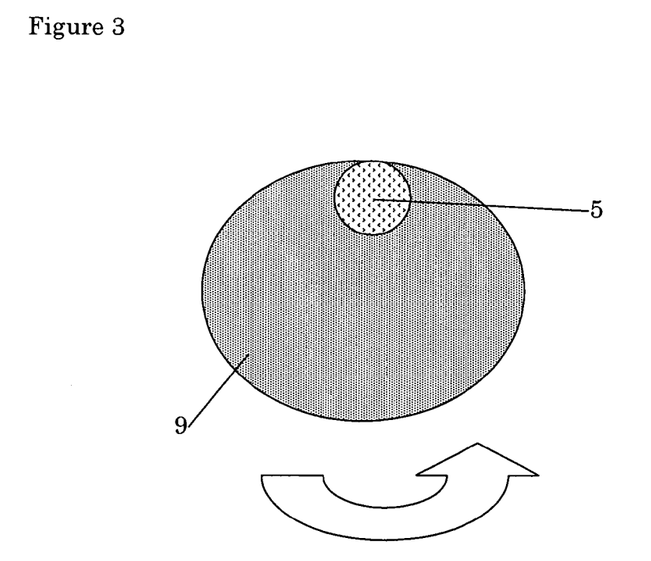
FIG. 3 depicts a second embodiment of the invention.

As an alternative, in the embodiment of FIG. 3, the illustrated rotating disc 9 is solid to provide a closure to the radiation system 1. This is illustrated in more detail in FIG. 4, from which it is clear that the radiation system is compartmented by the disc 9 to provide a pressure barrier between a buffer gas pressure source 10 and the EUV radiation source 2. Thus, the plasma source 2 can be operated in a vacuum pressure section 11 independent from a pressure regime in the section 14 separated by the disc 9. Thus, the source 2 can be operated at a vacuum pressure.

Figure 4:
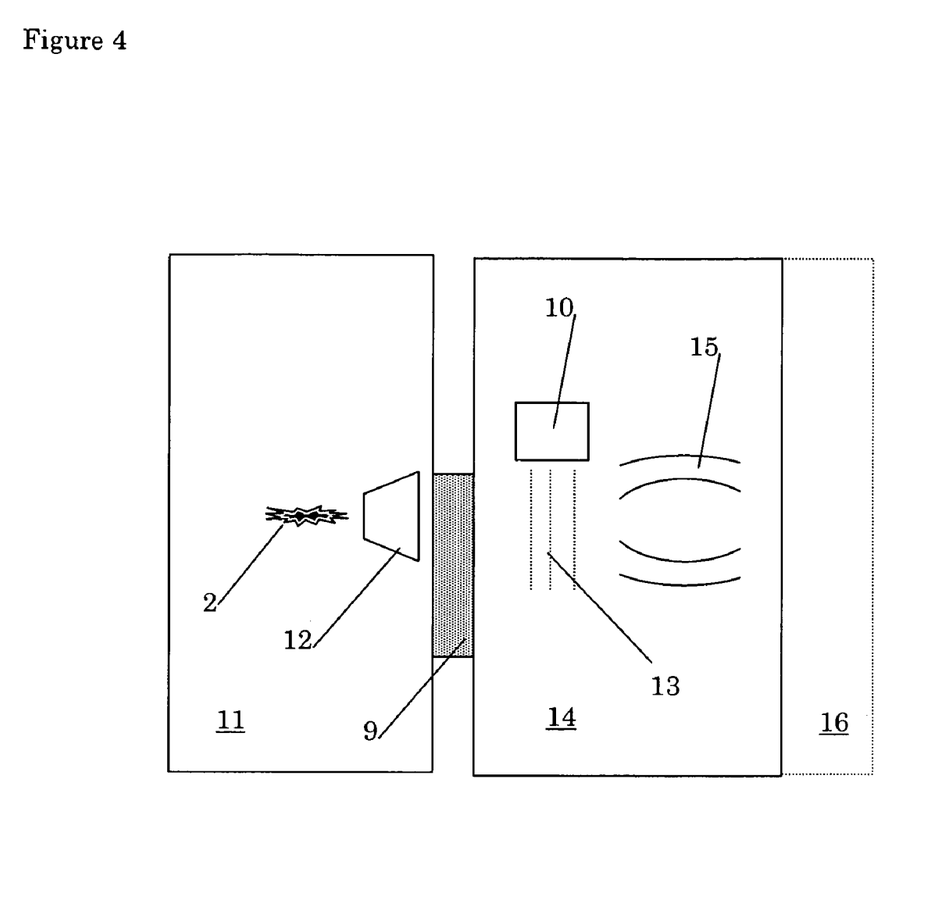
FIG. 4 depicts the second embodiment of the invention viewed from a side.

Between the source and the rotating disc 9 debris mitigation means may be present, in particular, a foil trap 12. This is a device that uses a high number of closely packed foils aligned generally parallel to the direction of the light generated by the EUV source.

Contaminant debris 4, such as micro-particles, nano-particles and ions can be trapped in walls provided by foil plates (not shown). Thus, the foil trap 12 functions as a contamination barrier trapping contaminant material from the source. In the section 14 opposite to the foil trap 12 and source 2 in vacuum pressure section 11, relative to the disc 9 functioning as a pressure barrier, the buffer pressure source 10 may stop residual contamination which is not stopped by the foil trap 12 and by the rotating disc 9 arrangement.

Typically, this can be ion like contamination which can be trapped by using a buffer gas flow 13 at a low pressure. In the section next to this buffer gas operated debris mitigating section 14 a collector 15 may be present which functions to collect EUV radiation from said EUV source and focus the EUV radiation into a beam that is further conditioned downstream by illuminator and/or projection optics. Thus, the collector converges said EUV radiation from said EUV source 2 to further EUV optics. Such a collector element 15 may be cylinder symmetric along a central axial direction and may comprise concentrically curved shell formed reflective surfaces that are stacked at a distance ranging substantially between 1 and 7 cm. Alternatively it may be of a multilayer normal incidence type.

In operation, the method of spectrally filtering a beam 3 of radiation according to the invention comprises providing a pulsed EUV source 2 generating EUV radiation in conjunction with debris 4 traveling from the source 2; mounting a spectral filter 5 in front of the EUV source for selectively passing a spectral range of a beam 3 of EUV radiation from said EUV source 2; and moving said spectral filter 5 in synchronicity with the pulsed EUV source 2 to prevent traveling debris 4 from impacting the spectral filter 5.

Figure 5:
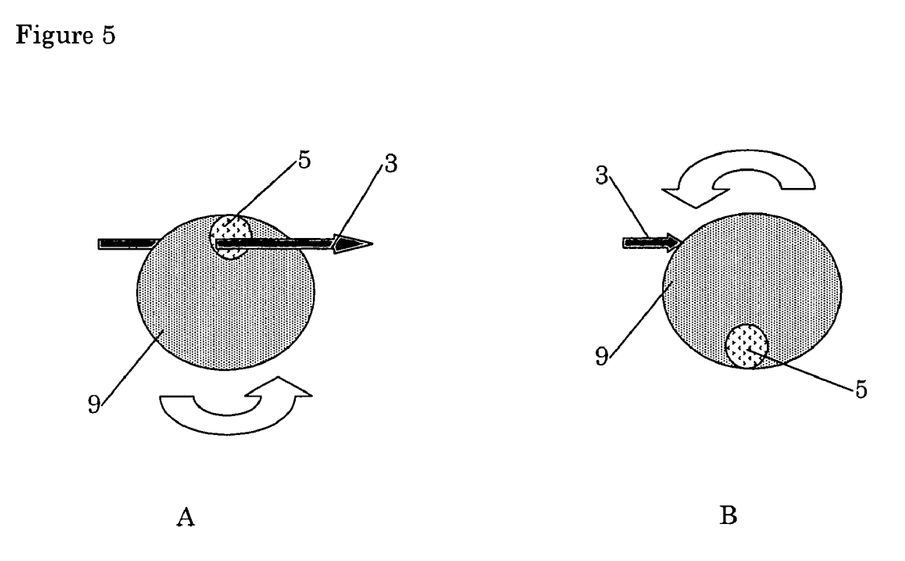
FIG. 5 depicts a special operating method of the second embodiment.
Figure 6:
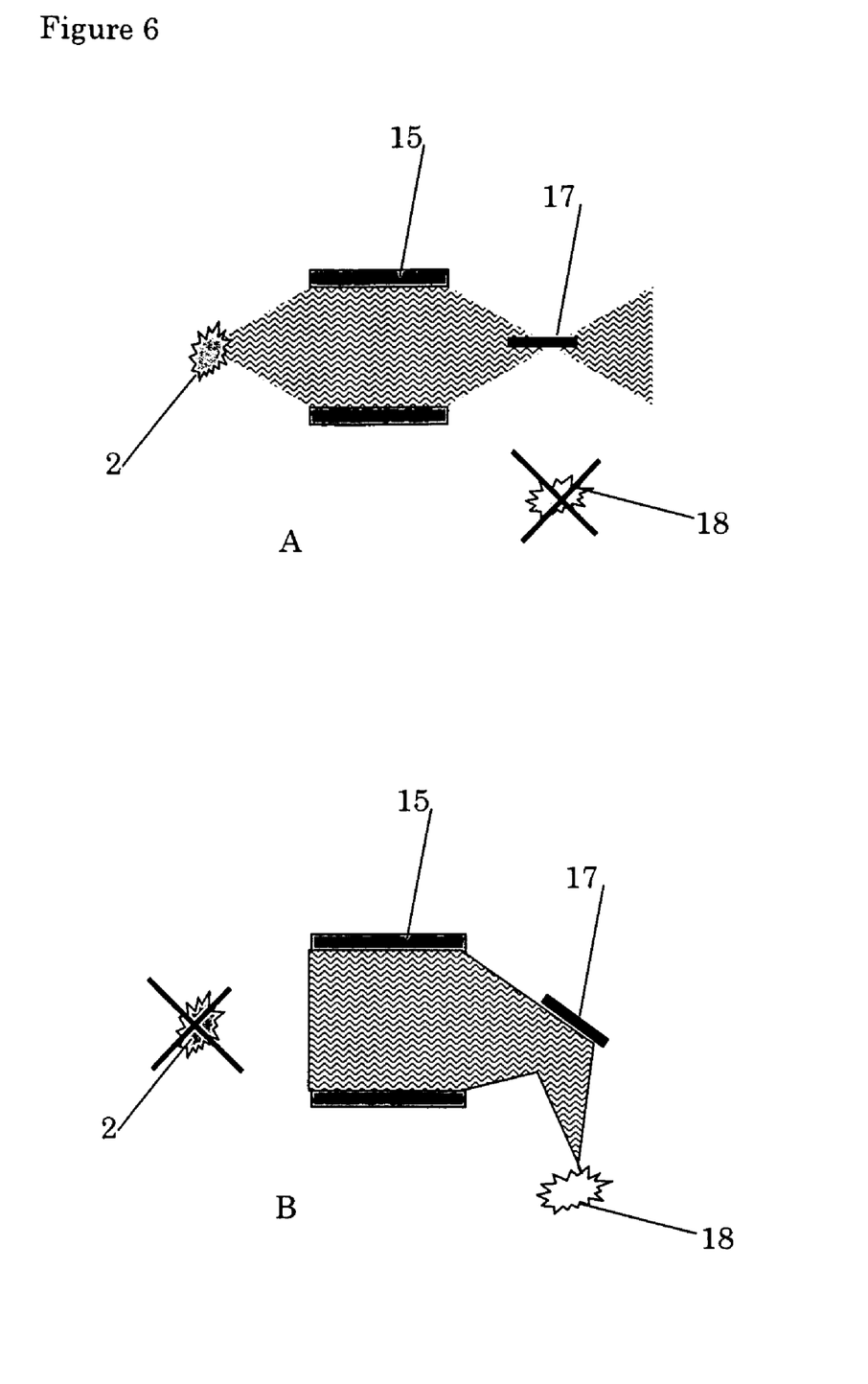
FIG. 6 depicts an alternative embodiment carrying out the special operating method depicted in FIG. 5.

FIG. 5 depicts a special operating method of the second embodiment depicted in FIG. 3. Indeed, alternatively, or additionally, the rotating disc 9 can be operated in a section indicated in FIG. 4 at 16. Typically, in this section 16, the EUV radiation passes an intermediate focus as shown in FIG. 6. Hence, the rotating disc 9 can function as a shutter for blocking EUV light selectively. In this embodiment the collector 15 is positioned between the shutter 9 and the EUV source 2. In the intermediate focus position, advantageously, the rotating disc 9 can be very small in diameter, and accordingly can be made to rotate faster than at other positions.

Thus, the shutter 9 can be used to selectively transmit light into the downstream optics (not shown) of an EUV lithographic apparatus as shown in FIG. 1. In this way, between processing steps, e.g. in a time span when the lithographic apparatus is not actively transferring an image to a substrate, but, for instance is in an intermediate phase of handling a substrate or changing a reticle, the EUV source 2 can be kept on running in a pulsed way, thus keeping the temperature of the collector 15 stabilized. Thus, temperature fluctuations of the collector 15 can be prevented, increasing the efficiency of the EUV radiation system 1. Also, the lifetime of the source is enhanced and the load on the other downstream optics is reduced.

Accordingly, in operation, the embodiment of FIG. 5 is used for shutting the beam 3 of EUV radiation while keeping the collector 15 heated by the EUV source. Specifically, FIG. 5A indicates a pass mode of the rotating spectral filter. In this mode, the spectral filter is moved synchronously with the on-periods of the pulsed laser source 2, so that the spectral filter 5 'sees' the radiation coming from the pulsed source 2. In FIG. 5B the beam 3 of EUV radiation is blocked by the shutter, that is formed by the solid disc 7. This can be provided by de-synchronizing the rotating spectral filter 5 with the pulsed source 2, for example, by introducing a short delay in the pulses of the pulsed source 2. In this mode, the spectral filter is moved synchronously with the off-periods of the pulsed laser source 2, so that the spectral filter 5 does not 'see' the radiation coming from the pulsed source 2 and the disc 7 accordingly blocks EUV radiation.

By the arrangement according to the invention, the spectral filter can be selectively used only when EUV radiation passes without the presence of debris. The spectral filter is therefore moved away at the impact time of contaminant debris particles that are by nature slower than the EUV radiation. It is noted that U.S. Pat. No. 4,408,338 discloses a rotating disc arrangement which selectively traps debris depending on a difference in velocity of debris and generated electromagnetic radiation. However, this publication does not mention placement of an EUV filter, nor the need for protecting this filter from debris.

FIG. 6 depicts an alternative embodiment carrying out the special operating method. Aspects of this embodiment can be characterized as follows:

- A radiation system for generating a beam of radiation comprising: a pulsed EUV source generating EUV radiation in conjunction with debris traveling from the source; a collector for collecting EUV radiation from said EUV source; and a shutter for selectively blocking the EUV beam; said collector positioned between the shutter and the EUV source.
- A radiation system for generating a beam of radiation comprising: a pulsed EUV source generating EUV radiation in conjunction with debris traveling from the source; a collector for collecting EUV radiation from said EUV source; a tiltable mirror for coupling out EUV radiation from the collector and/or coupling in radiation from an alternative light source into the collector; and said collector positioned between the tiltable mirror and the EUV source.
- A method of temperature stabilizing a collector for collecting EUV radiation from an EUV source, the method comprising: providing an EUV source generating EUV radiation; providing a collector for collecting EUV radiation from said EUV source; providing a shutter for selectively blocking an EUV beam generated from said EUV source; positioning said collector between the shutter and the EUV source; and selectively blocking said EUV radiation while keeping the collector heated by the EUV source.
- A method of temperature stabilizing a collector for collecting EUV radiation from an EUV source, the method comprising: providing an EUV source generating EUV radiation; providing a collector for collecting EUV radiation from said EUV source; providing a tiltable mirror; positioning said collector between the mirror and the EUV source; and tilting said mirror for selective outcoupling of EUV radiation from the collector and/or incoupling of radiation from an alternative light source into the collector while keeping the collector heated.

In particular, in FIG. 6A a normal operation mode is shown wherein in an intermediate focus a tiltable mirror 17 is placed, in particular, a mirror that has a high grazing incidence reflectivity. Since the mirror is in the intermediate focus the mirror can be kept small.

In FIG. 6B, an alternative operation is illustrated, where the tiltable mirror 17 is tilted with respect to the normal operation mode. In this position, radiation from an alternative light source 18 can be coupled into the collector 15 while keeping the collector heated.

In one embodiment, the mirror 17 can be provided by the rotating shutter arrangement 9 illustrated in FIG. 5. This can be done in conjunction with alternatively synchronizing the EUV source 2 or the alternative light source 18 with the rotating shutter arrangement.

In another embodiment not illustrated, selectively, EUV radiation from the collector 15 can be coupled out to keep the collector 15 heated and the EUV source 2 running.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultra-violet (UV) radiation (e.g. having a wavelength of or about 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation system for generating a beam of radiation comprising:
    a pulsed EUV source configured to generate EUV radiation; and
    a spectral filter mounted in front of the EUV source to selectively pass a spectral range of a beam of EUV radiation from said EUV source,
    said spectral filter being mounted on a movable mount configured to be moved in synchronicity with the pulsed EUV source.

2. A radiation system according to claim 1, wherein said spectral filter is mounted on a rotatable disc that is distanced from the source so as to provide a temporal separation of EUV radiation generated from the source and debris traveling from the source to prevent the debris from impacting the spectral filter.

3. A radiation system according to claim 2, wherein said rotatable disc is solid to provide a closure to said radiation system.

4. A radiation system according to claim 3, further comprising a buffer gas pressure source configured to create a pressure in said system to trap debris; and wherein said rotatable disc is arranged to provide a pressure barrier.

5. A radiation system according to claim 4, wherein said pressure barrier provides a barrier between the buffer gas pressure source and the EUV radiation source.

6. A radiation system according to claim 1, wherein said spectral filter is configured to selectively pass radiation with wavelengths in a range of about 10–20 nm.

7. A radiation system according to claim 1, wherein said spectral filter comprises a Zr/Si multilayer filter or a Zr/Nb multilayer filter.

8. A radiation system according to claim 1, wherein the movable mount is configured to be rotated to synchronize the spectral filter with an on-period of the pulsed EUV beam.

9. A radiation system according to claim 1, further comprising a processing circuit configured to control a timing of pulses of the pulsed EUV source to synchronize the spectral filter or a shutter with an on-period of the pulsed EUV beam.

10. A radiation system according to claim 9 wherein said radiation system further comprises a collector configured to collect EUV radiation from said EUV source, said collector being positioned between the shutter and the EUV source.

11. A radiation system according to claim 10, wherein said shutter is placed at an intermediate focus of the collector.

12. A radiation system according to claim 10, wherein said collector is a cylinder and comprises concentrically curved reflective surfaces stacked at a distance ranging substantially between 2 and 7 cm.

13. A radiation system according to claim 1, wherein said EUV source is a laser induced plasma source or a discharge produced plasma source.

14. A radiation system according to claim 13, wherein said plasma source comprises tin or Xe.

15. A method of spectrally filtering a beam of radiation comprising:
    generating EUV radiation with a pulsed EUV source;
    selectively passing a spectral range of a beam of EUV radiation from said EUV source through a spectral filter mounted in front of the EUV source; and
    moving said spectral filter in synchronicity with the pulsed EUV source to prevent debris traveling from said EUV source from impacting the spectral filter.

16. A method according to claim 15, further comprising
    selectively blocking said EUV beam or passing a selected spectral range of said EUV beam using a rotable disc on which are mounted said spectal filter and a shutter;
    collecting EUV radiation from said EUV source using a collector, said collector positioned between the shutter and the EUV source; and
    blocking said beam of EUV radiation while keeping the collector heated by the EUV source.

17. A method according to claim 16, wherein blocking said beam of EUV radiation is provided by de-synchronizing the rotating spectral filter with the pulsed EUV source.

18. A lithographic apparatus comprising:
    a radiation system configured to generate a beam of radiation, said radiation system comprising a pulsed EUV source configured to generate EUV radiation, and a spectral filter mounted in front of the EUV source to selectively pass a spectral range of a beam of EUV radiation from said EUV source;
    a support configured to hold a patterning device, the patterning device configured to pattern the beam of radiation; and
    a projection system configured to protect the patterned beam of radiation onto a substrate,
    said spectral filter being mounted on a movable mount configured to be moved in synchronicity with the pulsed EUV source.

19. A lithographic apparatus according to claim 18, wherein said spectral filter is mounted on a rotatable disc that is distanced from the source so as to provide a temporal separation of EUV radiation generated from the source and debris traveling from the source to prevent the debris from impacting the spectral filter.

20. A lithographic apparatus according to claim 19, wherein said rotatable disc is solid to provide a closure to said radiation system.

* * * * *